(12) United States Patent
Chen et al.

(10) Patent No.: US 7,239,544 B2
(45) Date of Patent: Jul. 3, 2007

(54) ELECTRICAL MEMORY COMPONENT AND A METHOD OF CONSTRUCTION THEREOF

(75) Inventors: Zhizhang Chen, Corvallis, OR (US); Lori Tully, Albany, OR (US); Hang Liao, Corvallis, OR (US); Robert N. Bicknell, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 226 days.

(21) Appl. No.: 10/941,503

(22) Filed: Sep. 14, 2004

(65) Prior Publication Data

US 2006/0056235 A1    Mar. 16, 2006

(51) Int. Cl.
*G11C 11/00* (2006.01)
*G11C 7/00* (2006.01)
(52) U.S. Cl. .................................. 365/163; 369/126
(58) Field of Classification Search ............. 365/163; 369/126, 13.33
See application file for complete search history.

(56) References Cited

U.S. PATENT DOCUMENTS 5,804,710 A * 9/1998 Mamin et al. ................ 73/105
5,812,516 A * 9/1998 Nose et al. .................. 369/126
2002/0101795 A1 * 8/2002 Wickramasinghe et al. ... 369/43

OTHER PUBLICATIONS

Tyler Lowrey, OUM, Ovonyx, Inc. Dec. 1999, http://www.ovonyx.com/nvmts_11_02.pdf.
HP, HP Labs, ARX: HP'S probe storage program, http://www.hp.com/hpinfo/abouthp/iplicensing/ars.html.
Y.C. Chen, et al, Chalcogenide memory looks promising, EETIMES, Sep. 19, 2003, http://www.eet.com/in_focus/silicon_engineering/OEG20030919S0044.
J. Maimon, et al, Intergration and Circuit Demonstration of Chalcogenide Memory Elements with a Radiation Hardened CMOS Technology.

* cited by examiner

*Primary Examiner*—Son Dinh

(57) ABSTRACT

An electrical memory component is provided, comprising read/write probes and a chalcogenide storage media. Each read/write probe is adapted for selective electrical connection to a memory portion of the chalcogenide storage media and for performing read and write operations upon the memory portion. The chalcogenide storage media has a second plurality of memory portions, and is movably mounted relative to the first plurality of read/write probes for selective electrical connection of the read/write probes to a subset of the memory portions.

12 Claims, 4 Drawing Sheets

ELECTRICAL MEMORY COMPONENT AND A METHOD OF CONSTRUCTION THEREOF

FIELD OF THE PRESENT INVENTION

The present invention relates generally to electrical memory devices, and more specifically the present invention relates specifically to an electrical memory component and a method of construction thereof.

BACKGROUND OF THE PRESENT INVENTION

High data density storage devices are increasingly sought after, with portable devices such as mobile phones driving demand for high density data storage, preferably provided by a small storage device having low power consumption. With such stringent power consumption limitations, non-volatile memory, which retains data even when disconnected from a power source, is desirable in such applications.

One proposal for such high density non volatile memory applications provides for a polymer storage media movably mounted upon a micro-mover. The micro-mover is operable to move the polymer storage media over a range of movement which is only a fraction of the size of the storage media itself. The micro mover locates the storage media relative to an array of probe tips, with sufficient accuracy to enable as small as 3 nm positional increments. Each probe tip emits an electron beam to read and write a bit of the storage media. Writing to the polymer involves heating the polymer to cause dimpling, while reading from the polymer is achieved by a second order electrical effect which exists when the probe tip is in a dimple.

Providing an array of read/write probes which are movable relative to the storage media avoids the need for dedicated hardwired read/write components associated with every bit of the storage media. Thus a large number of storage bits may be provided in a reduced area, with each read/write probe operable to access a plurality of the storage bits of the storage media.

However, it is a problem that each probe tip requires a high voltage (~700V) to operate, and a further problem that reliance on an electron beam necessitates an adequate vacuum seal of the packaging.

SUMMARY OF THE PRESENT INVENTION

An electrical memory component is provided. The electrical memory component includes a first plurality of read/write probes. Each read/write probe is for selective electrical connection to a memory portion of a storage media and for performing read and write operations upon the memory portion. The electrical memory component further includes a chalcogenide storage media having a second plurality of memory portions. The chalcogenide storage media is movably mounted relative to the first plurality of read/write probes for selective electrical connection of the read/write probes to a subset of the memory portions.

DETAILED DESCRIPTION OF THE EMBODIMENTS OF THE PRESENT INVENTION

Figure 1:
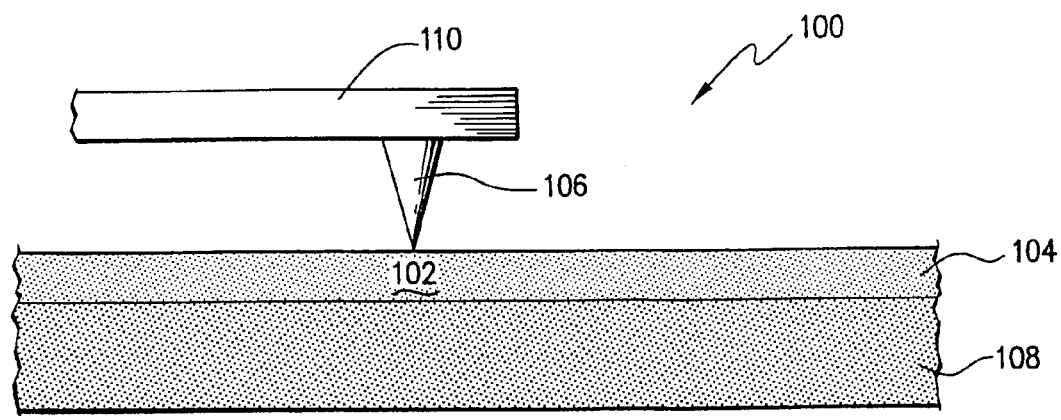
FIG. 1 is a schematic showing a memory portion of a movable storage media engaged by a tip electrode in accordance with an embodiment of the present invention.

FIG. 1 is a schematic of a portion of an electrical memory component 100, showing a tip electrode 106 engaging a memory portion 102 of a movable storage media 104. Memory portion 102 includes a portion of storage media 104 subjected to crystallisation and amorphisation during set/reset write operations performed by electrode tip 106. In the exemplary embodiment, storage media 104 includes a film of chalcogenide material, $Ge_2Sb_2Te_5$, formed over a substrate 108. Many memory portions such as memory portion 102 are provided in two dimensions throughout the storage media 104.

Tip electrode 106 is mounted on a cantilever arm 110, which is operable to selectively press tip electrode 106 against the storage media 104. Notably, tip electrode 106 tapers to a point, in the exemplary embodiment the point being of the order of 30 nm diameter, and thus provides for a small area of contact to the chalcogenide storage media 104. The small contact is of importance for the resistive phase change, and is provided without need for advanced photolithography processes. Providing a small tip diameter further provides for a higher data storage density, and a smaller power consumption of read/write operations. Further, current flowing through the small tip 106 causes a phase change of only a small volume of chalcogenide material such as memory portion 102, thus utilizing a low current to achieve such a phase change, and increasing tip 106 lifetime. Electrical memory component 100 includes multiple such tip electrodes serving as read/write probes.

The chalcogenide storage media 104 and substrate 108 are movably mounted relative to the electrode tip 106, such that one of a plurality of memory portions of storage media 104 may be positioned adjacent the electrode tip 106. Thus, in the exemplary embodiment, electrode tip 106 is operable to be pressed against and to perform read/write operations on more than one memory portion of the storage media 104.

In the exemplary embodiment, read/write operations performed by electrode tip 106 are controlled such that memory portion 102 and other memory portions of the storage media 104 adopt a small lateral dimension in the plane of storage media 104. The exemplary embodiment thus provides for adjacent memory portions to be closely positioned. In the exemplary embodiment, the memory portions of storage media 104 are positioned at a lateral spacing smaller than a lateral dimension of the cantilever arm. In one embodiment, the memory portions may adopt a lateral spacing of substantially 35 nm centre-to-centre. The exemplary embodiment thus provides for high data density and avoids the limitations imposed by lithographic minimum feature size limits. Additionally no individual bit addressing is needed.

Rear contacts are formed on a rear side of the chalcogenide storage material 104 opposite the tip 106, by use of a metal/silicon ohmic contact.

Figure 2:
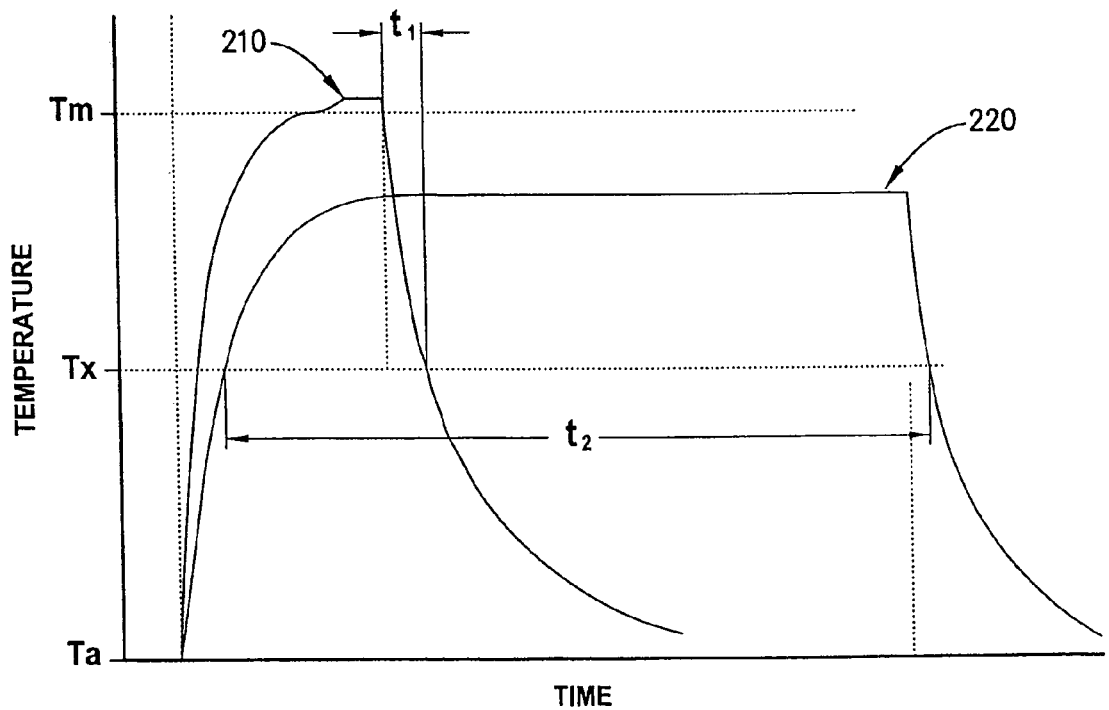
FIG. 2 is a plot of temperature vs. time showing the temperature response of the memory portion of FIG. 1 to set and reset pulses applied in write operations in accordance with an embodiment of the present invention.

FIG. 2 is a plot of temperature vs. time showing the temperature response of the memory portion 102 to set and reset pulses applied by the electrode tip 106 in performing read/write operations. Plot 210 shows the temperature response of the memory portion 102 to an amorphising reset current pulse. The amorphising reset current pulse is of sufficient magnitude to cause the $Ge_2Sb_2Te_5$ memory portion 104 to heat as shown by plot 210, to a temperature greater than a melting temperature $T_m$ of $Ge_2Sb_2Te_5$, before being allowed to rapidly cool within time period $t_1$ to a temperature below the crystallisation temperature $T_x$ of $Ge_2Sb_2Te_5$ such that the memory portion 102 is returned to an amorphised state.

Plot 220 shows the temperature response of memory portion 102 to a crystallising current pulse. Application of such a crystallising current pulse causes the memory portion 102 to heat as shown in plot 220 above the crystallising temperature $T_x$, while remaining below the melting temperature $T_m$. The temperature of memory portion 102 is maintained above the crystallising temperature $T_x$ and below the melting temperature $T_m$ throughout time period $t_2$, which is of sufficient duration to promote crystallisation of memory portion 102. In the exemplary embodiment $t_2$ is less than substantially 200 ns, thus supporting rapid read/write cycles.

When in an amorphised state, the memory portion 102 possesses electrical resistivity and optical reflectivity characteristics which are distinct from the electrical resistivity and optical reflectivity characteristics of the memory portion when it is in a crystalline state. Thus, electrical measurement of such resistivity characteristics can be used as read operations to determine whether the memory portion is amorphised or crystallised, thus providing for digital data storage.

Further, by providing a two state memory portion 102 which may be controllably set to an amorphised state or a crystallised state and which remains in that state without reliance on electrical biasing, the exemplary embodiment provides for a non-volatile memory which retains data even when not powered. Further, use of a chalcogenide $Ge_2Sb_2Te_5$ storage media in the exemplary embodiment provides for an electrical memory component 100 shown to support up to $10^{13}$ read/write cycles.

A chalcogenide $Ge_2Sb_2Te_5$ storage media further provides for low cost memory, as fabrication need merely create an amorphised layer of chalcogenide material without requiring further fabrication steps for isolation of memory portions. As an amorphised chalcogenide material possesses high resistivity, each memory portion is thus isolated from adjacent memory portions. That is, in the exemplary embodiment alteration of one memory portion at one location within the chalcogenide storage media 104 between amorphous and crystalline states does not cause electrical interaction with other memory portions at other locations within the storage media 104. Such a configuration is further advantageous in avoiding the complex fabrication of a crystallised layer or film as the storage media.

Additionally, the resistance of chalcogenide material when in an amorphous state is several orders of magnitude larger than when in a crystallised state, thus providing a large write and erasure margin and an improved signal to noise ratio for read operations.

Further, the provision in the exemplary embodiment of electrode tips selectively electrically connected to the memory portion 102 avoids the need for fabrication of dedicated contacts for every memory portion of the storage media 104, thus permitting closer spacing of the memory portions of the storage media, leading to higher data density, and also avoiding the time and cost of such fabrication.

While in the exemplary embodiment the storage media 104 includes $Ge_2Sb_2Te_5$, an alternate chalcogenide material may be used, such as $Ge_xSb_yTe_z$, or $In_xSe_y$.

In the exemplary embodiment each memory element such as memory element 102 is alternated between a crystallised state and an amorphised state so as to store binary data, a 1 or a 0. However, a chalcogenide material in an amorphous state has a resistivity several orders of magnitude larger than when in a crystallised state. Thus alternate embodiments may provide for multi-state operation of each memory portion, wherein the resistivity may be selected to be at an intermediate value between the amorphised state and the crystallised state. Each memory portion is thus operable to store more than one bit of information, and a single read or write operation accordingly reads or writes more than one bit of information. Such embodiments provide for yet higher data density and more rapid read and write operations of a given amount of data.

Figure 3A:
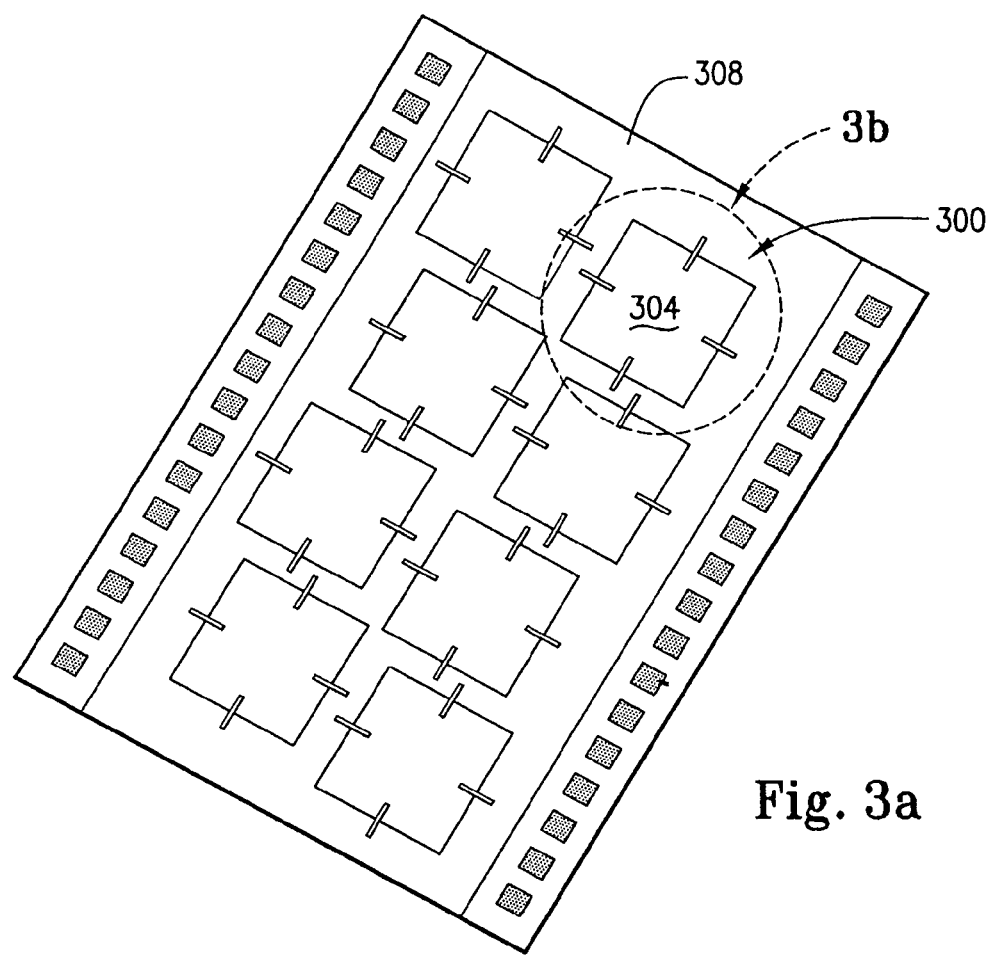
FIG. 3a and FIG. 3b illustrate a micro mover in accordance with an embodiment of the present invention.
Figure 3B:
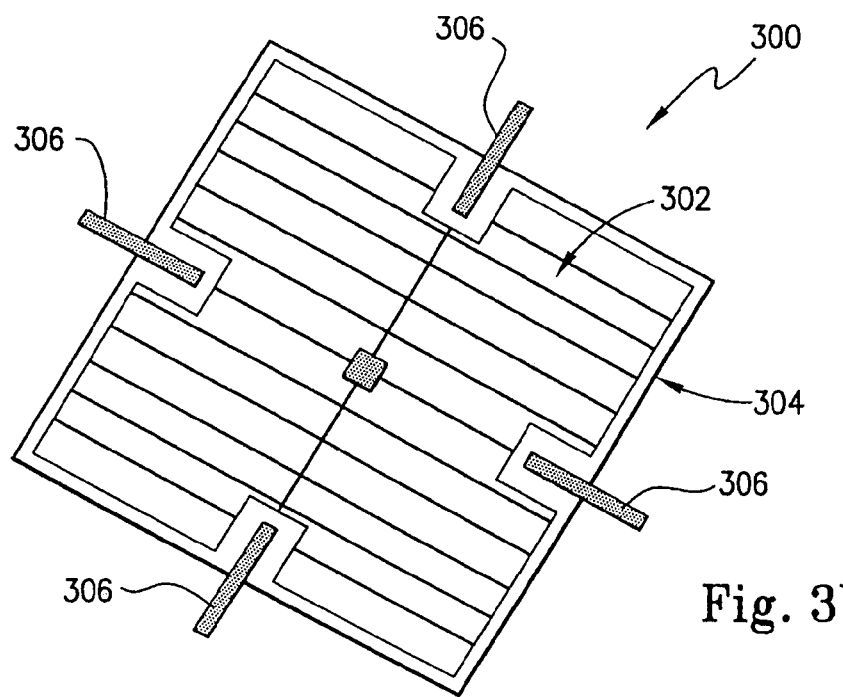

A suitable micro mover 300 is shown in FIG. 3a, being one of an array of micro movers. FIG. 3b is an enlarged view of micro mover 300, showing a plurality of data clusters 302 of micro mover 300. Micro mover 300 includes a moving platform 304 enabled for x and y axis movement by springs 306 connected to mechanical ground 308 and actuated by electrostatic stepper motors. Such a micro mover may provide for motion over a range of $+/-25^c$ cm in increments accurate to 1.5 nm.

Figure 4A:
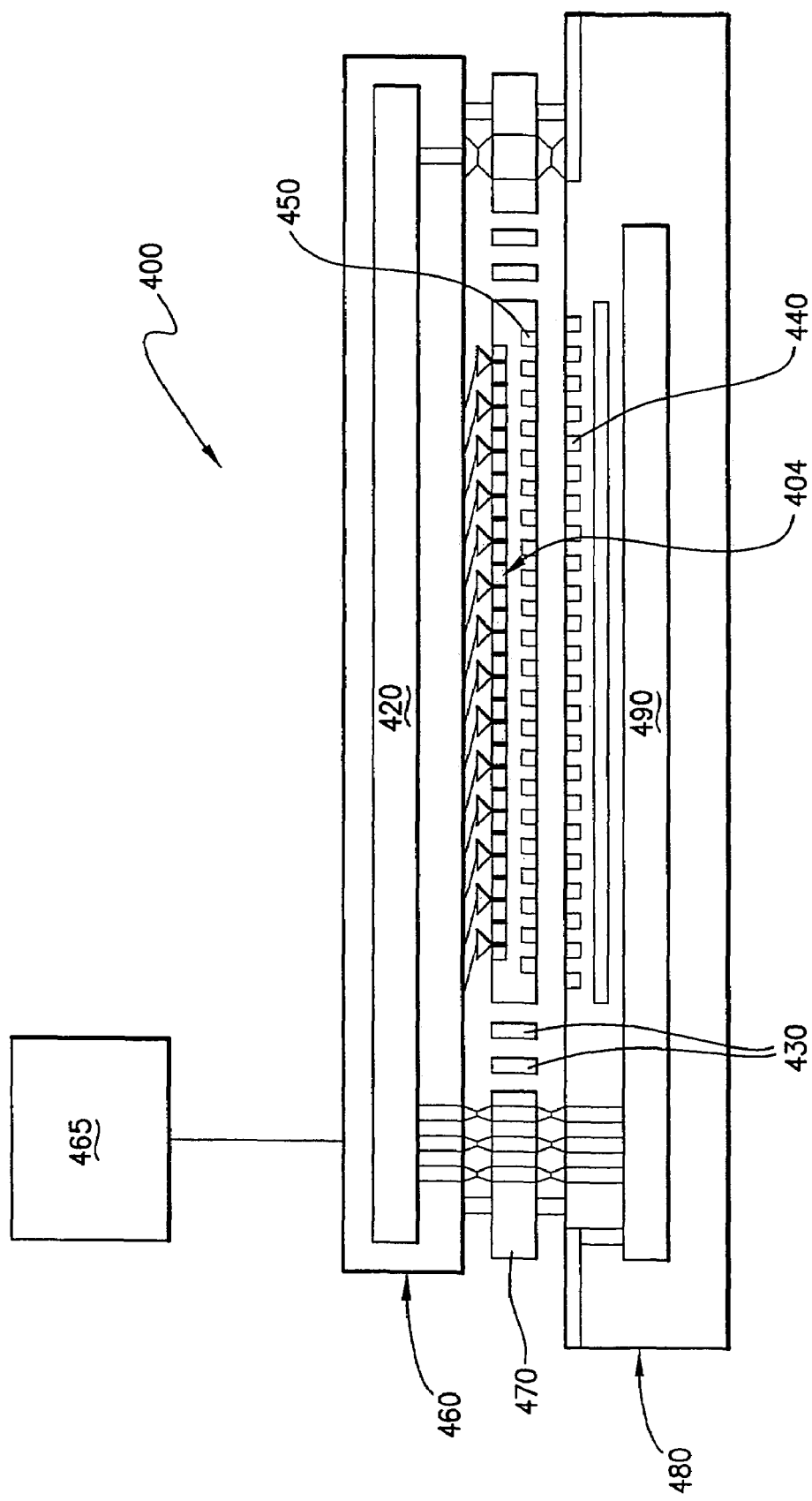
FIG. 4 illustrates an electrical memory component in accordance with an embodiment of the invention.
Figure 4B:
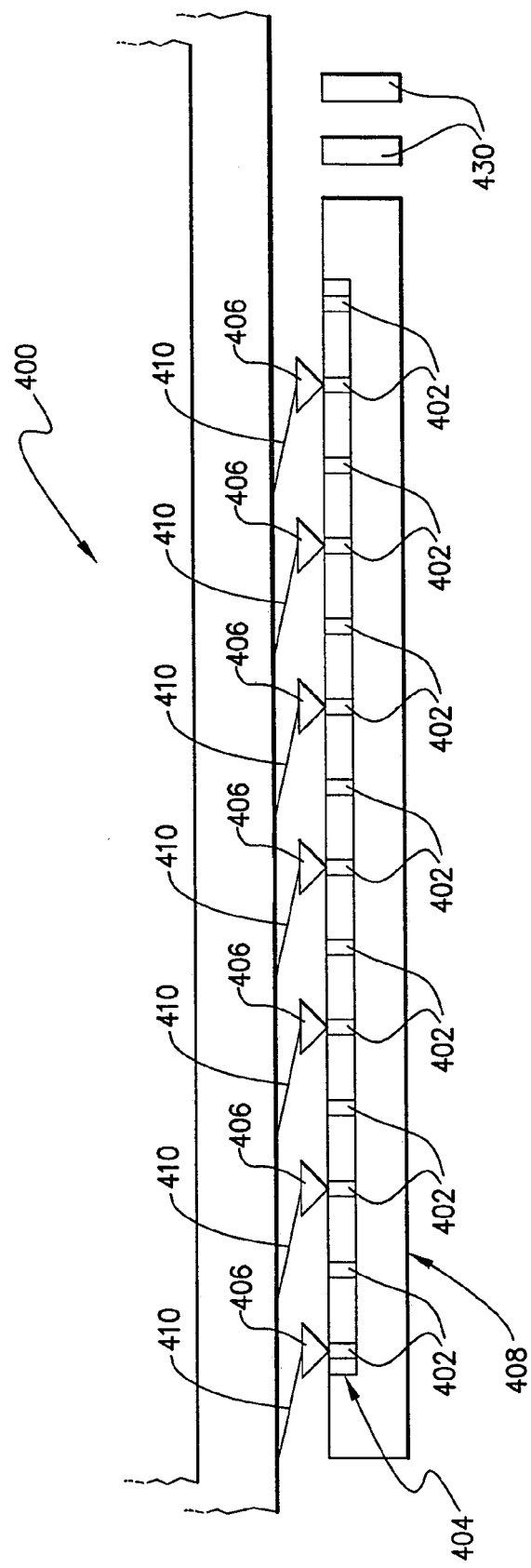

FIG. 4a illustrates an electrical memory component 400 in accordance with an embodiment of the present invention, while FIG. 4b is a partial expanded view of a portion of FIG. 4a. Electrical memory component 400 has a cantilever die 460 including CMOS and NMOS cantilever selection circuits 420. Cantilever die 460 further includes a plurality of cantilever arms 410 each carrying a read/write silicon tip 406. Pulse generator 465 generates pulses to set or reset one or more of memory portions 404 in the manner set out in FIG. 2.

Electrical memory component 400 further includes a rotor die 470, having a movable portion mounted on springs 430. The movable portion of the rotor die 470 supports a storage media 404 and rotor electrodes 450. Electrical memory component 400 further includes a stator die 480 having CMOS stator electronics 490 and stator electrodes 440.

Each cantilever arm 410 is operable to selectively press the associated read/write tip 406 against chalcogenide storage media 404. Storage media 404 includes a plurality of memory portions 402, there being a greater number of memory portions 402 than read/write tips 406. Storage media 404 is formed on a substrate 408, with substrate 408 being the movable portion of rotor die 470 of a micro mover, such that storage media 404 is movable relative to the read/write tips 406. Springs 430 of the micro mover enable a selected subset of memory portions 402 to be positioned adjacent the plurality of read/write tips 406.

The exemplary embodiment further provides an electrical memory component operable at low voltage, such as 3V, in a simple structure.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. An electrical memory component comprising:
   a first plurality of read/write probes, each read/write probe for selective electrical connection to a memory portion of a storage media and for performing read and write operations upon the memory portion; and a chalcogenide storage media having a second plurality of memory portions, wherein the memory portions of the chalcogenide storage media are spaced at intervals smaller than a lateral dimension of each of the read/write probes and the chalcogenide storage media being movably mounted relative to the first plurality of read/write probes for selective electrical connection of the read/write probes to a subset of the memory portions.

2. The electrical memory component of claim 1, wherein the chalcogenide storage media is mounted to a micromover for selectively electrically connecting the read/write probes to the subset of the memory portions.

3. The electrical memory component of claim 1 wherein the read/write probe comprises a read/write tip mounted on a cantilevered arm, the read/write tip being selectively pressed against the storage media by the cantilevered arm.

4. The electrical memory component of claim 1 comprising a pulse generator to generate a current pulse to be applied by one of said read/write probes to set a memory portion, the pulse operable to maintain the memory portion above a crystallisation temperature and below a melting temperature for a sufficient period for the memory portion to crystallise.

5. The electrical memory component of claim 1, comprising a pulse generator to generate a current pulse to be applied by one of said read/write probes to reset a memory portion, the pulse operable to heat the memory portion above a melting temperature and to allow the memory portion to cool sufficiently rapidly to avoid crystallisation.

6. The electrical memory component of claim 1, wherein the second plurality is greater than the first plurality.

7. A method of constructing an electrical memory component, the method comprising:

providing a first plurality of read/write probes, each read/write probe for selective electrical connection to a memory portion of a storage media and for performing read and write operations upon the memory portion; and movably mounting a chalcogenide storage media having a second plurality of memory portions relative to the first plurality of read/write probes for selective electrical connection of the read/write probes to a subset of the memory portions wherein the memory portions of the chalcogenide storage media are provided at spacings smaller than a lateral dimension of each of the read/write probes.

8. The method of claim 7 wherein movably mounting comprises mounting the chalcogenide storage media to a micro mover for selectively electrically connecting the read/write probes to the subset of the memory portions.

9. The method of claim 7 wherein providing a first plurality of read/write probes comprises providing a plurality of read/write tips each mounted on a respective cantilevered arm, each cantilevered arm being operable to press the read/write tip against the chalcogenide storage media.

10. The method of claim 7 comprising providing a pulse generator to generate a current pulse to be applied by one of said read/write probes to set a memory portion, the pulse operable to maintain the memory portion above a crystallisation temperature and below a melting temperature for a sufficient period for the memory portion to crystallise.

11. The method of claim 7 comprising providing a pulse generator to generate a current pulse to be applied by one of said read/write probes to reset a memory portion, the pulse operable to heat the memory portion above a melting temperature and to allow the memory portion to cool sufficiently rapidly to avoid crystallisation.

12. The method of claim 7 wherein the second plurality is greater than the first plurality.

* * * * *

UNITED STATES PATENT AND TRADEMARK OFFICE
CERTIFICATE OF CORRECTION

| | | |
|---|---|---|
| PATENT NO. | : 7,239,544 B2 | Page 1 of 1 |
| APPLICATION NO. | : 10/941503 | |
| DATED | : July 3, 2007 | |
| INVENTOR(S) | : Zhizhang Chen et al. | |

It is certified that error appears in the above-identified patent and that said Letters Patent is hereby corrected as shown below:

In column 5, line 13, in Claim 3, after "claim 1" insert -- , --.

In column 5, line 17, in Claim 4, after "claim 1" insert -- , --.

Signed and Sealed this

Seventh Day of October, 2008

JON W. DUDAS
*Director of the United States Patent and Trademark Office*